(12) United States Patent
Rubenstein

(10) Patent No.: US 6,798,663 B1
(45) Date of Patent: Sep. 28, 2004

(54) HEAT SINK HOLD-DOWN WITH FAN-MODULE ATTACH LOCATION

(75) Inventor: Brandon A. Rubenstein, Loveland, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/419,386

(22) Filed: Apr. 21, 2003

(51) Int. Cl.[7] .......................... H05K 7/20; H01L 23/40; H01L 23/36
(52) U.S. Cl. ....................... 361/710; 361/702; 361/696; 361/697; 361/709; 257/706
(58) Field of Search .................. 361/701–705, 361/706–712, 717–719, 722, 709, 710, 695–697; 257/707, 713, 717–719, 705, 706; 24/458, 297, 453, 457, 625; 248/510; 165/80.3, 185

(56) References Cited

U.S. PATENT DOCUMENTS

| | | | | |
|---|---|---|---|---|
| 4,769,744 A | * | 9/1988 | Neugebauer et al. ....... | 361/717 |
| 5,010,949 A | * | 4/1991 | Dehaine ...................... | 165/76 |
| 5,109,317 A | * | 4/1992 | Miyamoto et al. .......... | 361/715 |
| 5,208,731 A | * | 5/1993 | Blomquist ................... | 361/704 |
| 5,280,409 A | * | 1/1994 | Selna et al. ................. | 361/720 |
| 5,396,402 A | * | 3/1995 | Perugini et al. ............ | 361/704 |
| 5,521,439 A | * | 5/1996 | Casati et al. ................ | 257/718 |
| 5,570,271 A | * | 10/1996 | Lavochkin .................. | 361/704 |
| 5,581,441 A | * | 12/1996 | Porter ......................... | 361/701 |
| 5,615,735 A | * | 4/1997 | Yoshida et al. ............. | 165/80.3 |
| 5,621,615 A | * | 4/1997 | Dawson, deceased et al. .......................... | 361/704 |
| 5,734,556 A | * | 3/1998 | Saneinejad et al. ......... | 361/719 |
| 5,777,852 A | * | 7/1998 | Bell ............................ | 361/769 |
| 5,932,925 A | * | 8/1999 | McIntyre .................... | 257/719 |
| 5,990,552 A | * | 11/1999 | Xie et al. .................... | 257/718 |
| 6,115,253 A | * | 9/2000 | Clemens et al. ............ | 361/704 |
| 6,175,499 B1 | * | 1/2001 | Adams et al. ............... | 361/704 |
| 6,198,630 B1 | * | 3/2001 | Cromwell ................... | 361/704 |
| 6,208,517 B1 | * | 3/2001 | Prince et al. ................ | 361/704 |
| 6,219,239 B1 | * | 4/2001 | Mellberg et al. ............ | 361/704 |
| 6,229,703 B1 | * | 5/2001 | Lee ............................. | 361/704 |
| 6,353,537 B2 | * | 3/2002 | Egawa ........................ | 361/704 |
| 6,390,475 B1 | * | 5/2002 | Eckblad et al. ............. | 277/312 |
| 6,395,991 B1 | * | 5/2002 | Dockerty et al. ........... | 174/252 |
| 6,462,951 B2 | * | 10/2002 | Letourneau ................. | 361/704 |
| 6,496,371 B2 | * | 12/2002 | Winkel et al. .............. | 361/703 |
| 6,510,054 B1 | * | 1/2003 | Chen .......................... | 361/704 |
| 6,518,507 B1 | * | 2/2003 | Chen .......................... | 174/252 |
| 6,634,890 B2 | * | 10/2003 | Peterson et al. ............. | 439/67 |
| 2001/0028552 A1 | * | 10/2001 | Letornmeau ................ | 361/704 |

FOREIGN PATENT DOCUMENTS

| | | | | | |
|---|---|---|---|---|---|
| FR | | 0813383 A3 | * | 3/2002 | ........... F24D/19/02 |
| JP | | 2000059072 A | * | 2/2000 | ........... H05K/9/00 |
| WO | WO 9835540 A1 | * | 8/1998 | ........... H05K/7/20 |

* cited by examiner

Primary Examiner—Anatoly Vortman

(57) ABSTRACT

A system for heat sink hold-down is provided. The system comprises a heat source; and a heat sink hold-down assembly. The assembly comprises a bolster plate to rigidly support the heat source and a heat sink. The heat sink comprises a heat sink base operable to transfer heat and to press the heat source against the bolster plate, and a longitudinal post having a first end attached substantially orthogonally near the center of said heat sink base. The post is operable to transfer a compressive force substantially symmetrically to the heat sink base. The assembly further comprises a lever spring contacting the second end of the post. The lever spring is operable to apply a compressive force to the post in response to a bending moment. The assembly further comprises a cap rigidly coupled to the bolster plate and operable to apply a bending moment to the lever spring.

23 Claims, 6 Drawing Sheets

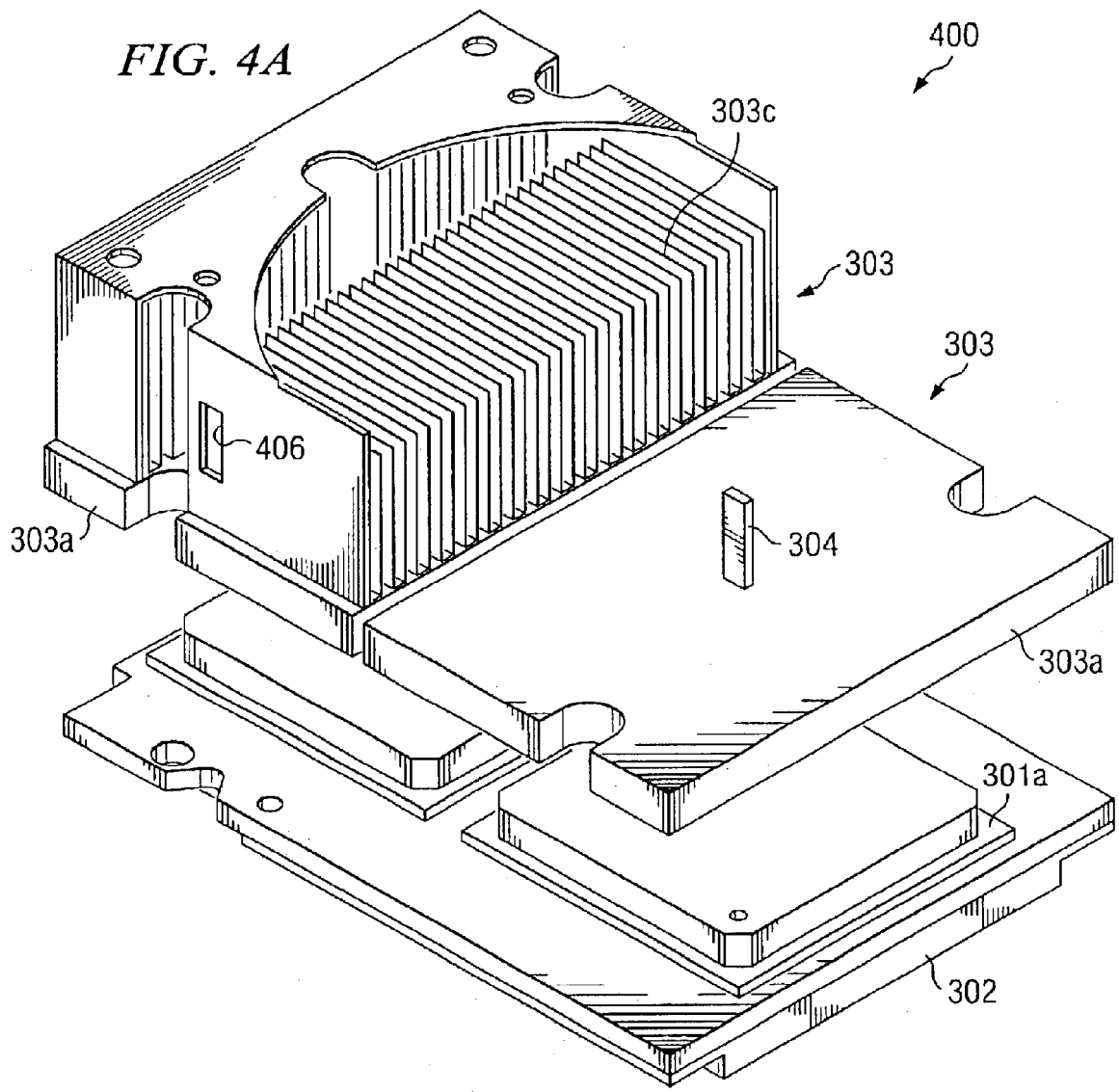

HEAT SINK HOLD-DOWN WITH FAN-MODULE ATTACH LOCATION

CROSS-REFERENCE TO RELATED APPLICATIONS

This application is related to concurrently filed, co-pending, and commonly assigned U.S. Patent Application Ser. No. 10/419,406, titled "VARIABLE WEDGE THERMAL INTERFACE DEVICE," filed Apr. 21, 2003, and to concurrently filed, co-pending, and commonly assigned U.S. Patent Application Ser. No. 10/419,373, titled "VARIABLE GAP THERMAL INTERFACE DEVICE," filed Apr. 21, 2003, the disclosures of which are hereby incorporated herein by reference.

FIELD OF THE INVENTION

This invention relates to heat transfer and more particularly to a heat sink hold-down with fan-module attach location.

DESCRIPTION OF RELATED ART

A number of approaches to heat sink hold down design have been used traditionally, including the examples described below:

FIG. 1 is a cross-sectional view of a traditional glue-on heat sink 101 attached to processor chip 102 with adhesive 103, which also acts as a thermally conducting interface. Processor chip 102 is typically mounted to bolster plate 104, which provides rigid mechanical support. Glue-on heat sinks have limited ability to hold on to the chip during a shock load. Using adhesive for thermal conduction compromises heat transfer compared to compression type heat sink attachment.

FIG. 2A is a cross-sectional view of a traditional shoulder screw/spring heat sink held under compression to a processor chip. Springs 201 are captured between heat sink base 202 and screw heads 203. When screws 204 are attached to bolster plate 104, the spring compression between screw heads 203 and heat sink base 202 loads heat sink 202 onto processor chip 102. Shoulder screw/spring heat sinks require a large amount of heat sink base space for mounting hardware. During installation they can cause uneven loading on the chip. Additionally, the screw assemblies are intrusive to air flow paths.

FIG. 2B is a cross-sectional view of a traditional low-profile spring-attach heat sink hold-down. Spring 211, which is rigidly mounted to bolster plate 104 and presses on the base of heat sink 212 against processor chip 102, has clearance slots for each heat sink fin. Low-profile spring-attach heat sink hold-down hardware is unobtrusive, but allows no place for mounting a fan to the top of the heat sink. It is also difficult to remove if chip replacement is required. Additionally it blocks air flow over the heat sink base.

FIG. 2C is a cross-sectional view of a traditional high-profile spring-heat sink hold-down. Spring 221 is rigidly mounted to bolster plate 104 and presses on the tops of the fins of heat sink 222. Alternatively, this traditional approach uses a screw running between the fins to transfer the load from spring 221 directly onto the base of heat sink 222. High profile springs intrude on the ability to mount a cooling fan on top of the heat sink.

It would be desirable in the art to provide a heat sink hold down system and method that minimize intrusion into the heat sink base space and into cooling air flow, that advantageously provide a location for mounting an optional fan, that load the chip essentially uniformly, and that allow easy removal to access the chip if required.

BRIEF SUMMARY OF THE INVENTION

In accordance with a first embodiment disclosed herein, a system for heat sink hold-down is provided. The system comprises a heat source; and a heat sink hold-down assembly. The heat sink hold-down assembly comprises a bolster plate operable to rigidly support the heat source and a heat sink. The heat sink comprises a heat sink base operable to press the heat source against the bolster plate and to transfer heat from the heat source, and a longitudinal post having a first end and a second end opposite from the first end, which is attached to the heat sink base substantially orthogonally near the center of said heat sink base. The post is operable to transfer a longitudinal compressive force substantially symmetrically to the heat sink base. The heat sink hold-down assembly further comprises a lever spring contacting near its midpoint the second end of the post. The lever spring is operable to apply a compressive force to the second end of the post in response to a bending moment. The heat sink hold-down assembly further comprises a cap rigidly coupled to the bolster plate and coupled to the lever spring near the two ends of the lever spring. The cap is operable to apply a bending moment to the lever spring.

In accordance with another embodiment disclosed herein, a method of heat transfer using a heat sink hold down assembly is provided. The method comprises attaching a first surface of a heat source onto a surface of a bolster plate and positioning a heat sink, such that a first surface of a heat sink base of the heat sink is in surface contact with a second surface opposite the first surface of the heat source. A longitudinal post having a first end and a second end opposite from the first end is attached at its first end substantially orthogonally to the second surface opposite the first surface of the heat sink base. The method further comprises applying longitudinal compressive force to the second end of the post in response to a bending moment of a lever spring in contact with the second end. The method further comprises transferring the longitudinal compressive force substantially symmetrically to the heat sink base, thereby holding the heat source rigidly under compression between the heat sink base and the bolster plate. The method further comprises transferring heat from the heat source through the heat sink into ambient air.

In accordance with another embodiment disclosed herein, a system for heat sink hold-down is provided. The system comprises means for attaching a first surface of a heat source onto a surface of a bolster plate, and means for positioning a heat sink, such that a first surface of a heat sink base of the heat sink is in surface contact with a second surface opposite said first surface of the heat source, and such that a longitudinal post having a first end and a second end opposite from the first end is attached at the first end substantially orthogonally to the second surface opposite the first surface of the heat sink base. The system further comprises means for applying longitudinal compressive force to the second end of the post in response to a bending moment of a lever spring in contact with the second end, and means for transferring the longitudinal compressive force substantially symmetrically to the heat sink base, thereby holding the heat source rigidly under compression between the heat sink base and the bolster plate. The system further comprises means for transferring heat from the heat source through the heat sink into ambient air.

BRIEF DESCRIPTION OF THE DRAWINGS

FIG. 4A is a cutaway view illustrating a system configured to include, for example, two heat sinks loaded onto two processor chips.

DETAILED DESCRIPTION

Figure 1:
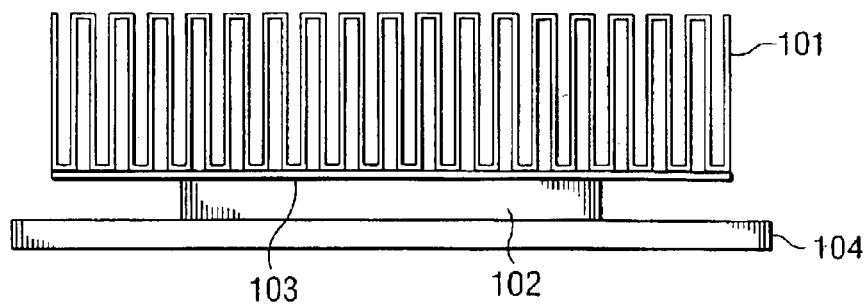
FIG. 1 is a cross-sectional view of a traditional glue-on heat sink.
Figure 2A:
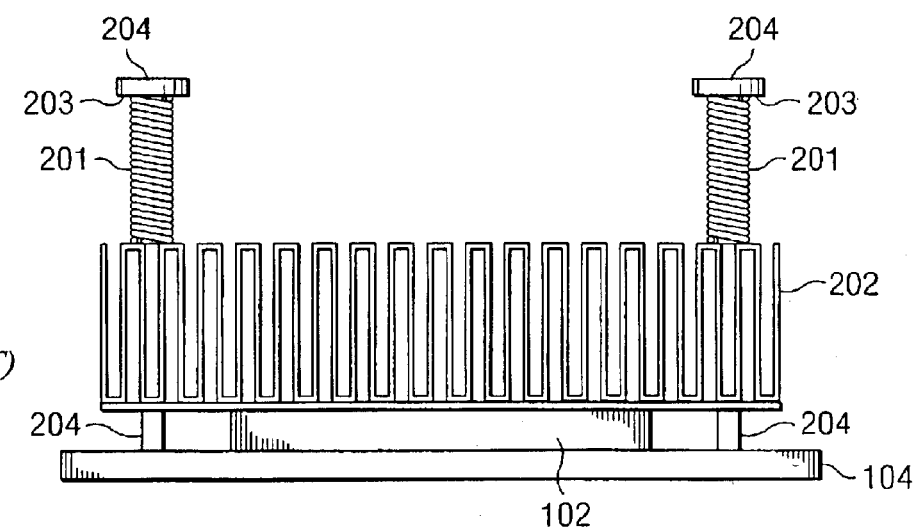
FIG. 2A is a cross-sectional view of a traditional shoulder screw/spring heat sink held under compression to a processor chip.
Figure 2B:
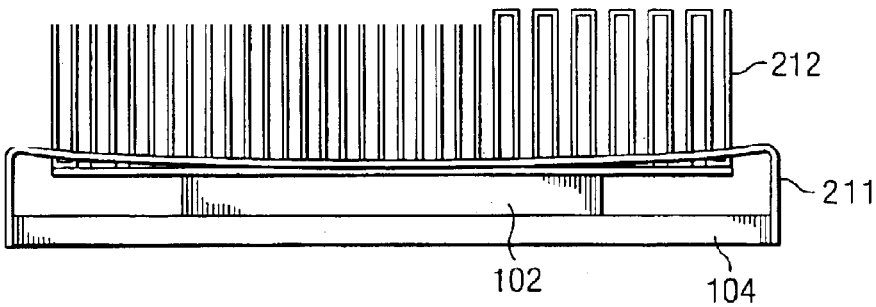
FIG. 2B is a cross-sectional view of a traditional low profile spring attach heat sink hold down.
Figure 2C:
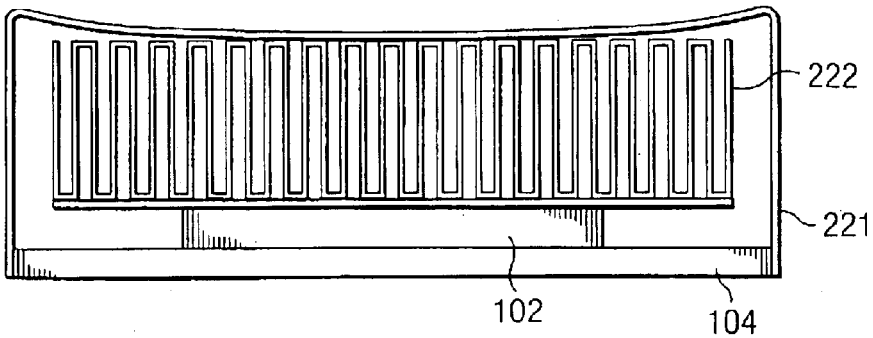
FIG. 2C is a cross-sectional view of a traditional high profile spring heat sink hold down.
Figure 3A:
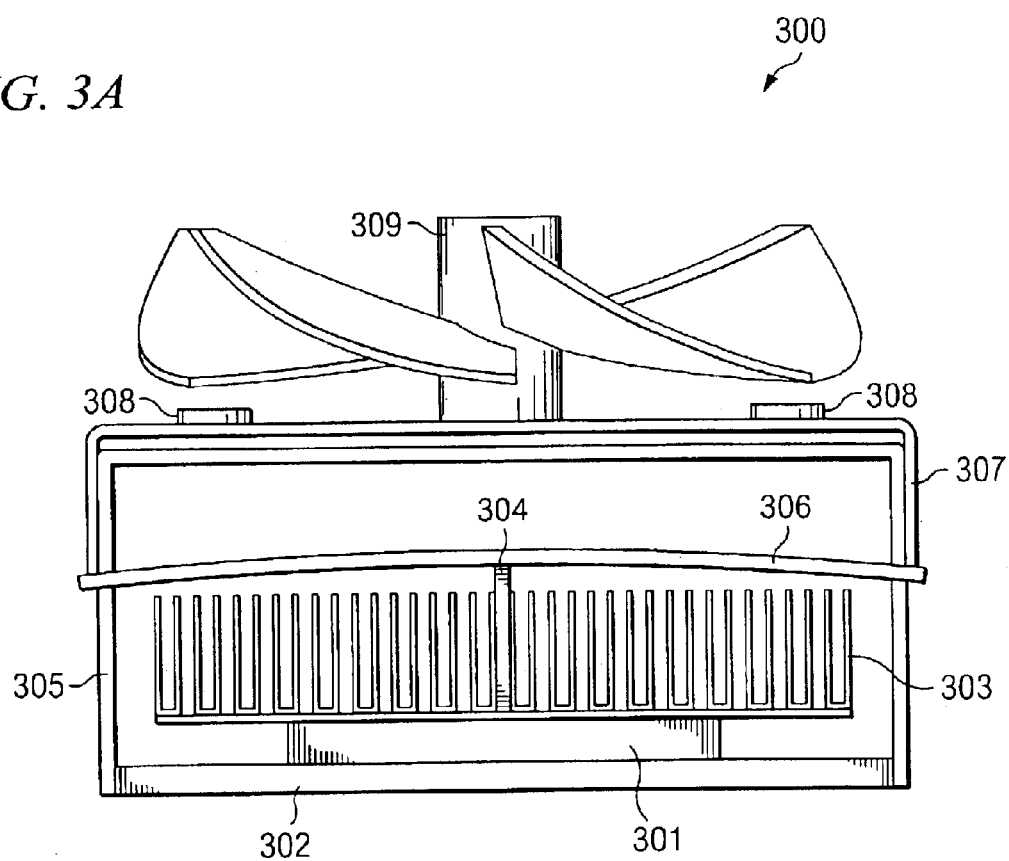
FIG. 3A is a simplified schematic cross-sectional view depicting a heat sink hold-down assembly with fan-module attach location, in accordance with embodiments of the present invention.
Figure 3B:
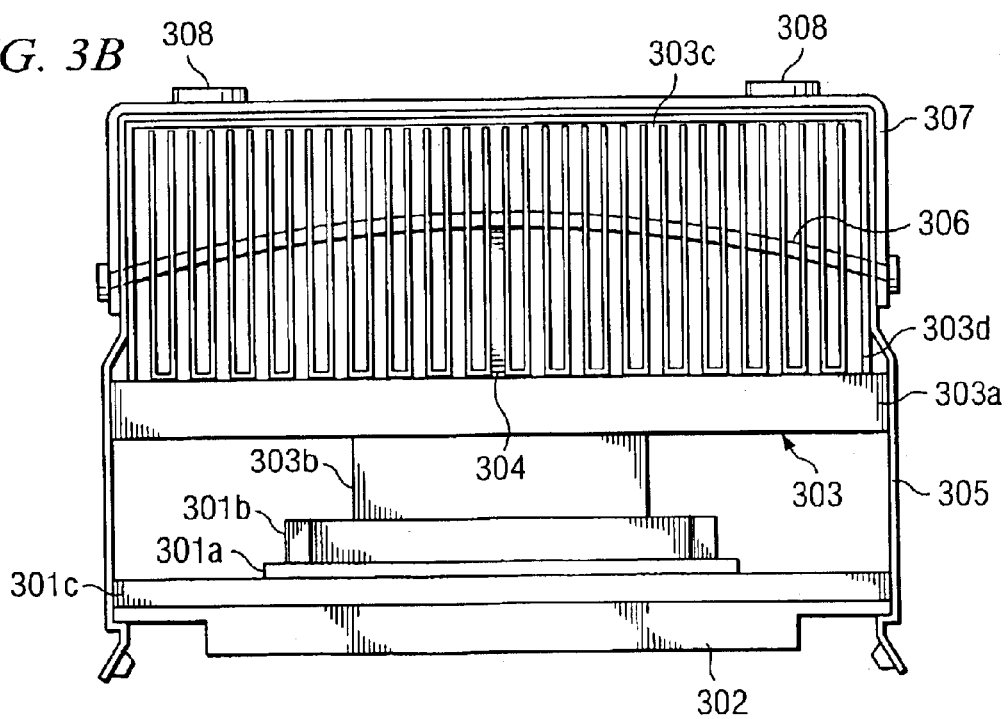
FIG. 3B is an expanded schematic cross-sectional view depicting in more detail an embodiment of the heat sink hold-down assembly of FIG. 3A.

FIG. 3A is a simplified schematic cross-sectional view depicting heat sink hold-down assembly 300 with fan-module attach location, in accordance with embodiments of the present invention. FIG. 3B is an expanded schematic cross-sectional view depicting in more detail an embodiment of heat sink hold-down assembly 300. A heat source, for example processor 301, is rigidly pressed between bolster plate 302 and heat sink 303. Processor 301 includes, for example, processor chip (integrated circuit) 301a mounted and electrically interconnected to a circuit board, for example circuit board 301c, which supplies the signal and power leads required by processor chip 301a, and optional lid 301b. Bolster plate 302 provides a mechanically stable, rigid support platform, which resists any bending of processor chip 301a and interconnected circuit board 301c. Heat sink 303 includes base 303a in mechanical and thermal contact with processor 301, centrally located vertical post 304, and optional heat sink extension or pillar 303b, which conducts heat from processor 301 to heat sink base 303a. Typically, heat sink 303 includes finned, folded, or corrugated structure 303c in intimate thermal contact with heat sink base 303a and having an enlarged surface area to facilitate heat transfer from heat sink 303 to ambient air. Gaps at interfaces between adjacent heat conducting elements can optionally be filled with thin layers of conventional heat conducting compound (thermal grease) to enhance heat transfer.

Cage 305 is a mechanical structure rigidly mounted to bolster plate 302 using clips or other fasteners, which provides clearance slots through which lever spring 306 is inserted, such that the top of post 304 contacts lever spring 306 near its midpoint. Cap 307, when fastened rigidly to cage 305 using screws 308 or other fasteners, applies downward force on lever spring 306 near its ends. This creates a bending moment in lever spring 306, which in turn applies a downward compressive load to post 304. If the point of contact is at the ideal midpoint of lever spring, the bending moment is symmetric and the compressive load is maximized. However, in some implementations an appreciable offset near the ideal midpoint can be tolerated without adverse consequences. Because of the central location of post 304, this load is distributed substantially symmetrically across the area of heat sink base 303a, which presses processor 301 against bolster plate 302. As used herein, the term "substantially symmetric" is interpreted to mean that there are no abrupt nonuniformities or discontinuities. Post 304 is oriented substantially orthogonally to heat sink base 303a, meaning that at least a portion of compressive force applied to post 304 by lever spring 306 is transferred to heat sink base 303a in a direction normal to the plane of heat sink base 303a. Although ideally the orientation of post 304 is orthogonal or at right angles to the plane of heat sink base 303a, a range of orientations is possible and will be referred to as "substantially orthogonal orientation." Similarly, a variety of shapes are possible for post 304, including for example truncated pyramidal, prismatic, cylindrical, and tubular. Heat sink hold-down assembly 300 exhibits mechanical integrity, such that compressive forces pressing processor 301 between lever spring 306 and bolster plate 302 are balanced by tensile forces transmitted through cage 305 from bolster plate 302 to cap 307. Optionally, cooling fan module 309 can be mounted atop cap 307 to provide forced air flow across heat sink 303, thereby increasing heat transfer efficiency.

FIG. 4A is a cutaway view illustrating system 400 configured to include, for example, two heat sinks 303 loaded onto two processor chips 301a. Embodiments of the invention can be configured to accommodate any number of heat sinks in a row. At a stage of assembly of system 400, one heat sink 303 is shown assembled in place onto heat sink base 303a, exposing clearance slot 406 in heat sink finned structure 303c, through which lever spring 306 is later inserted. Adjacent heat sink base 303a including centrally located post 304 is exposed in system 400. Post 304 provides a load point on heat sink base 303a directly above processor chip 301a for symmetric load distribution.

Figure 4B:
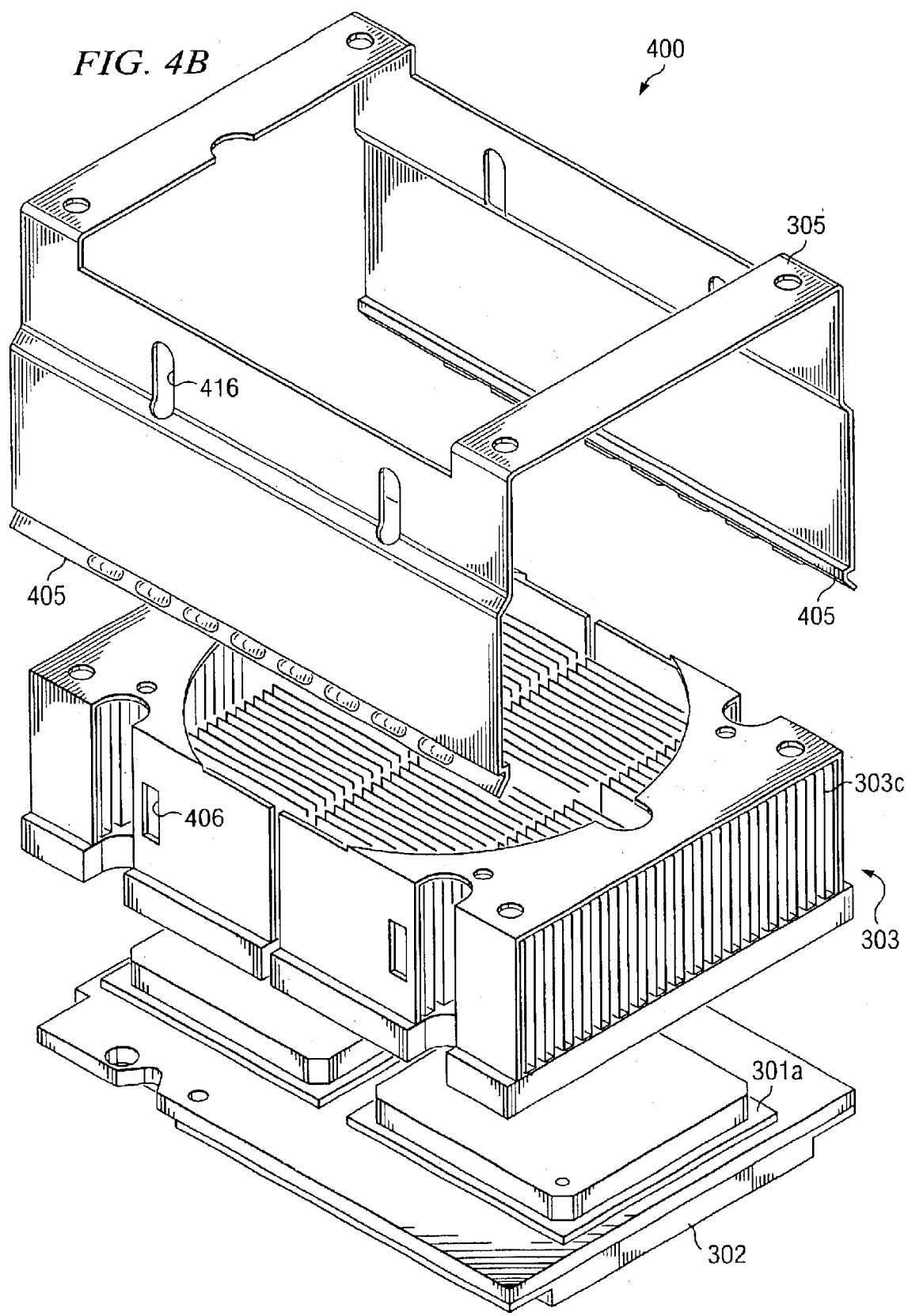
FIGS. 4B–4D are cutaway views depicting the system of FIG. 4A at further successive stages of assembly.
Figure 4C:
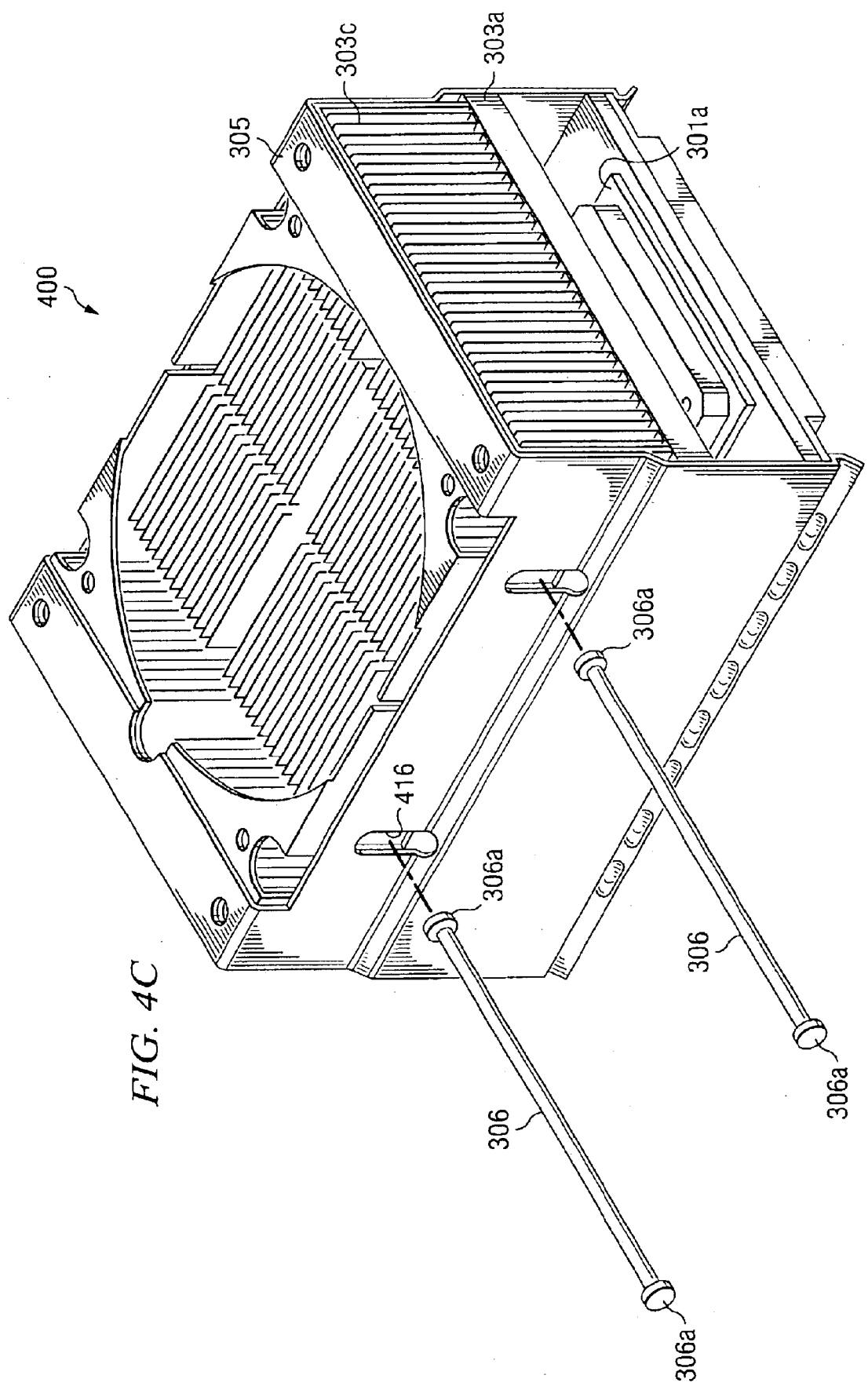
Figure 4D:
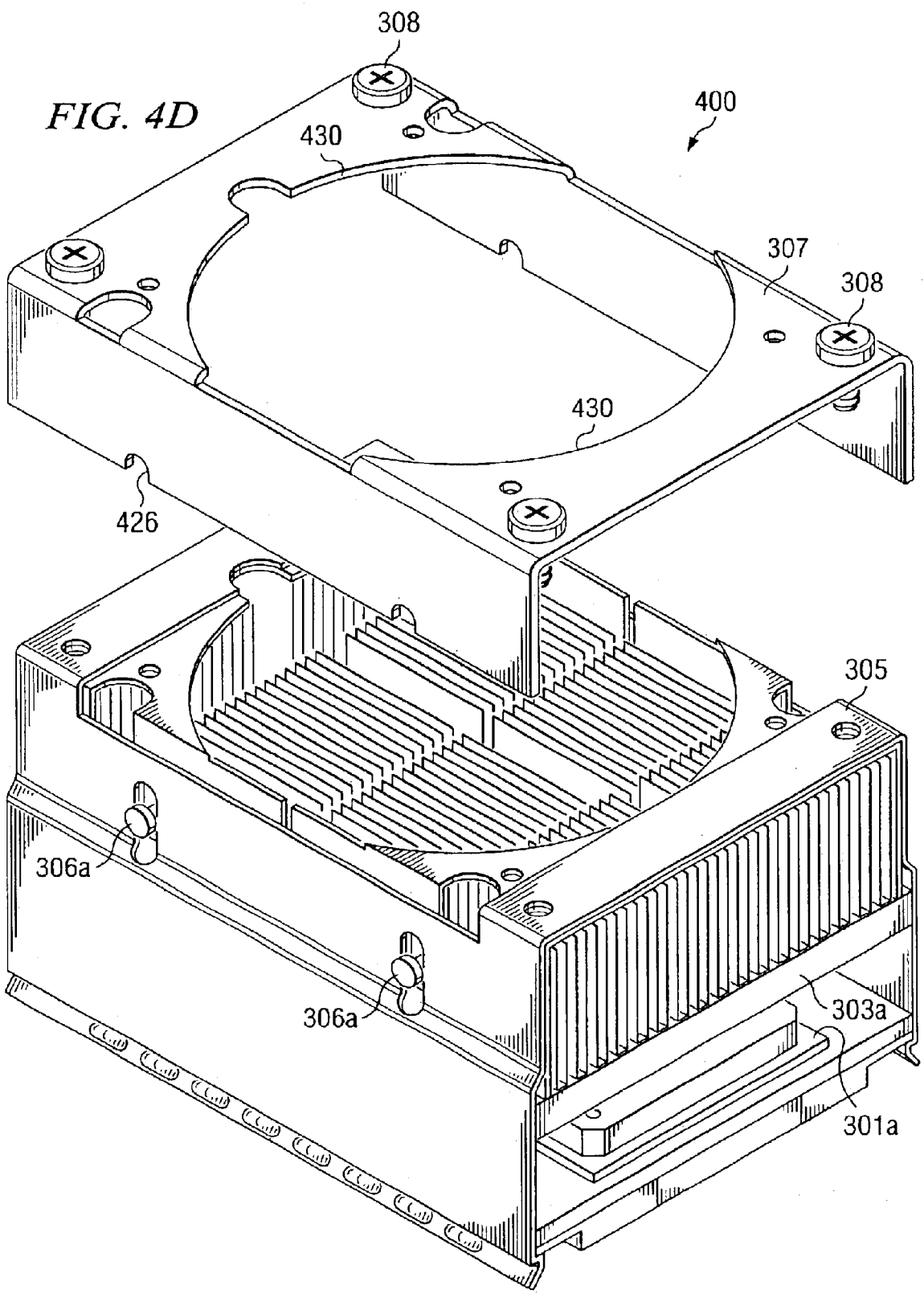

FIGS. 4B–4D are cutaway views depicting system 400 at further successive stages of assembly. In FIG. 4B, cage 305 is positioned over heat sink 303 assembled onto processor chip 301a. Flanges 405 at the lower edge of cage 305 are operable to hook onto the underside of bolster plate 302. Slots 416 in cage 305 aligned with slots 406 in heat sink finned structure 303c provide clearance for inserting lever springs 306. When lever springs 306 are loaded as described above, cage 305 provides tension to system 400. FIG. 4C illustrates lever springs 306 being assembled into system 400 by inserting through slots 416 in cage 305 and slots 406 in heat sink finned structure 303c and resting in contact with the upper end of post 304, which has its lower end attached centrally to heat sink base 303a (see FIG. 4B). In FIG. 4D, cap 307 is being placed onto system 400, where it is then fastened rigidly to cage 305 using screws 308 or other fasteners. Notches 426 at the lower edges of cap 307 engage and exert a downward force on the outer ends of lever springs 306, causing a bending moment in springs 306 about heat sink post 304, which then transmits and distributes the load between heat sink base 303a and processor chip 301a. Lever springs 306 may be provided with heads 306a at each end which may be captured by notches 426. As illustrated in FIG. 4D, cap 307 optionally contains opening 430, which can be configured to mount a cooling fan module, for example cooling fan module 309.

The implementation disclosed above provides a number of advantages. It affords minimal intrusion into the heat sink base space. It loads the heat sink from a post in the heat sink base centered on a processor chip, facilitating symmetric distribution of mechanical load onto the chip and minimizing air flow disruption. Simulation results show that air flow near the heat sink base is important to heat sink performance, and that disrupting air flow lowers this performance. Some embodiments provide a location to mount a fan module adjacent the top of the heat sink for enhanced air flow, and provide for easy disassembly and removal to access the chip if required.

In some alternative embodiments, cap 307 can be configured to extend to bolster plate 302, thereby eliminating cage 305 as a separate component of heat sink hold-down assembly 300. In such implementations, cap 307 may be attached rigidly to bolster plate 302 using screws, clips, and/or fasteners of other types. Other implementations include multiple heat sinks in a row, as illustrated in FIG. 4A, and alternative heat transfer structures that can be thicker, extruded, or cast into heat sink base 303*a* instead of thin finned, folded, or corrugated structure 303*c* as illustrated in FIGS. 3A and 3B.

What is claimed is:

1. A system for heat sink hold-down, comprising:
   a heat source; and
   a heat sink hold-down assembly comprising:
      a bolster plate operable to rigidly support said heat source;
      a heat sink comprising:
         a heat sink base operable to press said heat source against said bolster plate and to transfer heat from said heat source; and
         a longitudinal post having a first end and a second end opposite from said first end, said longitudinal post attached at said first end to said heat sink base substantially orthogonally near the center of said heat sink base, said post operable to transfer a longitudinal compressive force substantially symmetrically to said heat sink base;
      a lever spring contacting near its midpoint said second end of said post opposite from said first end, said lever spring operable to apply a compressive force to said second end of said post in response to a bending moment; and
      a cap rigidly coupled to said bolster plate and compressively coupled to said lever spring near the two ends of said lever spring, said cap operable to apply a bending moment to said lever spring.

2. The system of claim 1 wherein said heat source comprises a processor chip.

3. The system of claim 1 wherein said heat sink hold-down assembly further comprises a cage rigidly coupled to said bolster plate and said cap, said cage operable to transmit tensile force between said bolster plate and said cap.

4. The system of claim 3 wherein said cage comprises integral clips adjacent an edge of said cage, said integral clips operable to rigidly couple said cage to said bolster plate.

5. The system of claim 3 wherein said cage comprises openings that provide clearance to said ends of said lever spring.

6. The system of claim 3 wherein said cage is rigidly coupled to said cap using fasteners.

7. The system of claim 1 further comprising a fan module operable to provide forced air flow over said heat sink.

8. The system of claim 7 wherein said fan module is attached to said cap.

9. The system of claim 1 wherein said cap includes an opening operable to admit forced air flow onto said heat sink.

10. The system of claim 3 wherein said cage includes an opening operable to admit forced air flow onto said heat sink.

11. The system of claim 1 further comprising:
   a plurality of said heat sources;
   a plurality of said heat sinks; and
   a plurality of said lever springs.

12. The system of claim 1 wherein said heat sink further comprises a folded structure in intimate thermal contact with said heat sink base, said folded structure operable to facilitate heat transfer from said heat sink base to ambient air.

13. The system of claim 1 wherein said cap has a notch operable to engage said lever spring near each of said two ends of said lever spring.

14. The system of claim 13 wherein said lever spring has a head at each end, said head operable to cooperate with said notch to engage said lever spring.

15. A method of heat transfer using a heat sink hold down assembly, said method comprising:
   attaching a first surface of a heat source onto a surface of a bolster plate;
   positioning a beat sink, such that a first surface of a heat sink base of said heat sink is in surface contact with a second surface opposite said first surface of said heat source, and such that a longitudinal post having a first end and a second end opposite from said first end is attached at said first end substantially orthogonally to said second surface opposite said first surface of said heat sink base;
   applying longitudinal compressive force to said second end of said post in response to a bending moment of a lever spring in contact with said second end;
   transferring said longitudinal compressive force substantially symmetrically to said heat sink base, thereby holding said heat source rigidly under compression between said heat sink base and said bolster plate;
   applying a tensile force between said bolster plate and a cap rigidly coupled to said bolster plate, said cap being in contact with said lever spring;
   applying a bending moment to said lever spring from said cap in response to said tensile force; and
   transferring heat from said heat source through said heat sink into ambient air.

16. The method of claim 15 further comprising providing forced air convection across a surface of said heat sink, thereby increasing heat transfer efficiency.

17. The method of claim 16 comprising providing said forced air convection using a cooling fan module mounted proximate said heat sink.

18. The method of claim 15 wherein a notch in said cap engages a head on said lever spring at the end of said lever spring.

19. The method of claim 15 wherein said heat source comprises a processor chip.

20. The method of claim 15 wherein said first end of said longitudinal post is attached near the center of said second surface of said beat sink base.

21. A system for heat sink hold-down, comprising:
   means for attaching a first surface of a heat source onto a surface of a bolster plate;
   means for positioning a heat sink, such that a first surface of a heat sink base of said heat sink is in surface contact with a second surface opposite said first surface of said heat source, and such that a longitudinal post having a first end and a second end opposite from said first end is attached at said first end substantially orthogonally to said second surface opposite said first surface of said heat sink base;

means for applying longitudinal compressive force to said second end of said post in response to a bending moment of a lever spring in contact with said second end;

means for transferring said longitudinal compressive force substantially symmetrically to said heat sink base, thereby holding said heat source rigidly under compression between said heat sink base and said bolster plate; and means for transferring heat from said heat source through said heat sink into ambient air.

22. The system of claim 21 further comprising means for providing forced air convection over a surface of said heat sink, thereby increasing heat transfer efficiency.

23. The system of claim 21 further comprising:

means for applying a tensile force between said bolster plate and a cap rigidly coupled to said bolster plate, said cap being in contact with said lever spring; and means for applying a bending moment to said lever spring from said cap.

* * * * *